United States Patent [19]
Mayer

[11] 3,948,212
[45] Apr. 6, 1976

[54] COATING APPARATUS

[75] Inventor: Rolf Mayer, Winnenden, Germany

[73] Assignee: Robert Bosch G.m.b.H., Stuttgart, Germany

[22] Filed: July 18, 1974

[21] Appl. No.: 489,945

Related U.S. Application Data

[62] Division of Ser. No. 345,454, March 27, 1973, abandoned.

[30] Foreign Application Priority Data

Mar. 30, 1972  Germany............................ 2215623

[52] U.S. Cl. .................... 118/50; 118/63; 118/429; 118/610
[51] Int. Cl.² ........................................ B05C 3/09
[58] Field of Search ............ 118/400, 429, 300, 58, 118/50, 63, 73, 74; 117/102 L, 102 M, 95, 97, 98, 99; 228/37; 427/350, 351

[56] References Cited
UNITED STATES PATENTS

| | | | |
|---|---|---|---|
| 600,250 | 3/1898 | Reese................................ | 118/63 X |
| 3,200,788 | 8/1965 | Tardoskegyi..................... | 118/416 X |
| 3,268,653 | 8/1966 | McNutt............................ | 117/212 X |
| 3,357,856 | 12/1967 | Ragan et al...................... | 117/98 X |
| 3,482,755 | 12/1969 | Raciti............................... | 228/37 X |
| 3,589,590 | 6/1971 | Fitzsimmons.................... | 228/37 |
| 3,705,457 | 12/1972 | Tardoskegyi..................... | 118/72 X |

Primary Examiner—Morris Kaplan
Attorney, Agent, or Firm—Michael J. Striker

[57] ABSTRACT

An apparatus is disclosed for solder-coating a member provided with at least one passage having two open ends. The apparatus includes an arrangement for applying molten solder is applied to the member at least in the region of one of the open ends, and an arrangement for subsequently passing a pressure fluid through the passage prior to solidification of the molten solder so as to prevent possible blockage of the passage by the solder.

10 Claims, 2 Drawing Figures

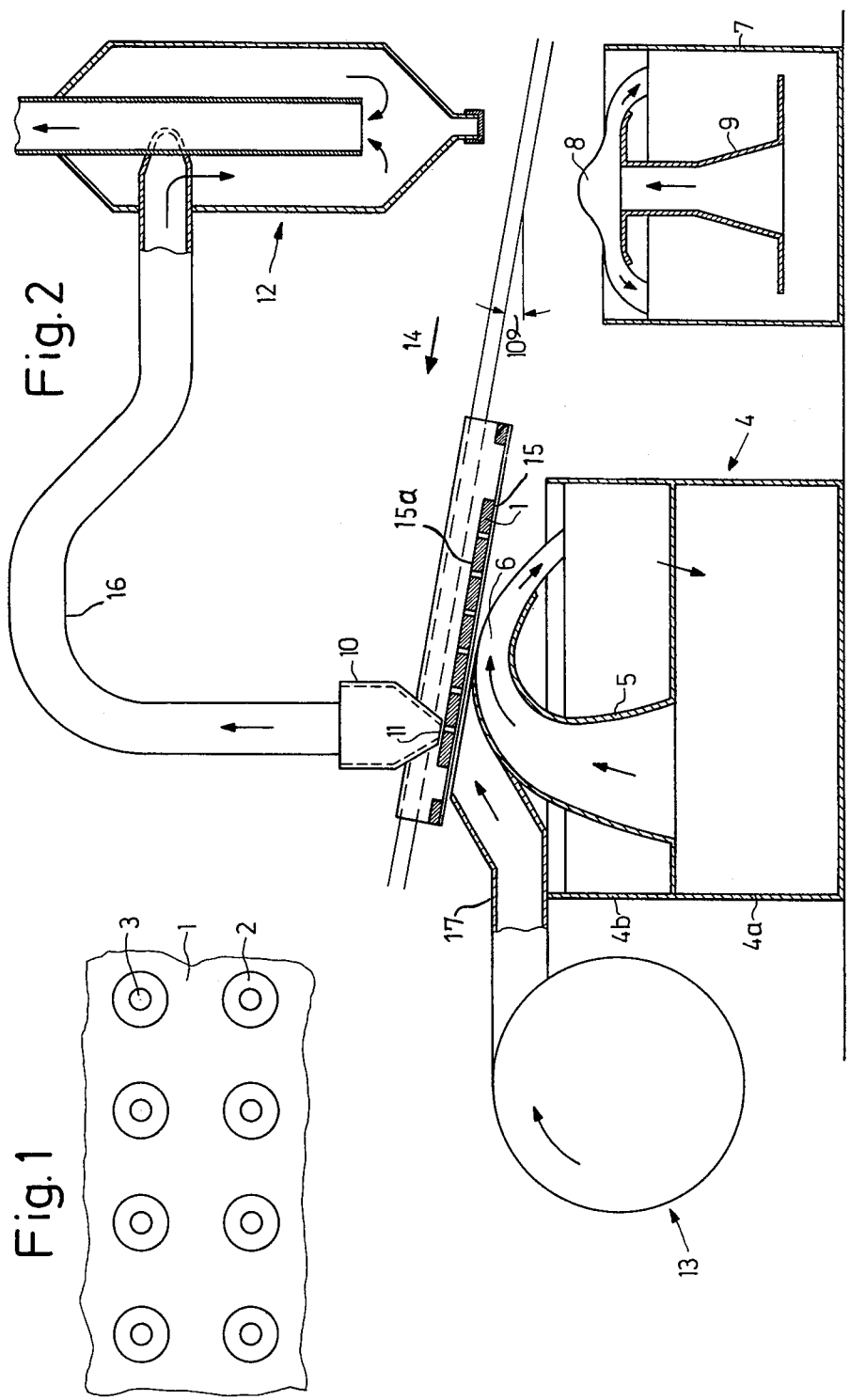

COATING APPARATUS

This is a division of application Ser. No. 345,454, filed Mar. 27, 1973, now abandoned.

BACKGROUND OF THE INVENTION

The invention relates generally to an apparatus for the coating of members with a hardenable material in flowable state. More particularly, the invention relates to an apparatus for the coating of members with solder such as, for example, soft solder, with special emphasis on arrangements wherein the surge technique is used to apply the molten solder to the member. The case of particular interest is that where the member to be coated is provided with one or more passages.

The application of molten soft solder to members capable of being wetted thereby so as to coat the members with solder is already known. The so-called "surge technique" wherein the member to be coated is passed through a stream or wave of molten solder has also become known. The term "surge technique" as used herein encompasses substantially all processes wherein a motion is imparted to any type of molten solder. In addition, it is also known to use the surge technique for applying molten solder to metal-coated or metallized printed circuit boards. It is further known to provide such boards with bores or passages prior to application of the molten solder thereto, these bores or passages being required during subsequent use of the boards. This sequence of steps, i.e. providing the boards with passages prior to application of the molten solder thereto, is advantageous from the point of view that the stamping or boring tools used to make the passages would become rapidly contaminated by the soft solder, were the passages to be made subsequent to application of the solder to the boards.

However, the application of molten solder to metallized printed circuit boards provided with passages leads to the problem that the solder may readily flow across the openings of the passages and/or into the passages. Thus, when the solder solidifies, the passages may be partially or completely blocked by solder which has solidified across the openings thereof or by solder which has flowed into the passages.

SUMMARY OF THE INVENTION

It is, accordingly, an object of the invention to provide an apparatus for coating of members having one or more passages, with a hardenable material in flowable state, whereby blockage of the passages by the material is prevented.

Another object of the invention is to provide an apparatus for coating of members having one or more passages, with a hardenable material in flowable state, using the surge technique, whereby blockage of the passages by the material is prevented.

In accordance with these and other objects, the invention provides an apparatus for coating a member provided with at least one passage having two open ends, with a hardenable material. The apparatus includes an arrangement for applying the material to the member, at least in the region of one of the open ends, while the material is in its flowable state. Subsequent to application of the material and prior to hardening thereof, a pressure fluid is caused to flow through the passage as a result of the action of a pressure differential producing arrangement so as to prevent possible blockage of the passage by the material.

The novel features which are considered as characteristic for the invention are set forth in particular in the appended claims. The invention itself, however, will be best understood from the following description of specific embodiments when read in connection with the accompanying drawing.

BRIEF DESCRIPTION OF THE DRAWING

FIG. 1 is a top view of a metallized printed circuit board provided with passages; and FIG. 2 is a schematic representation of one form of an apparatus according to the invention.

DESCRIPTION OF THE PREFERRED EMBODIMENTS

FIG. 1 shows a printed circuit board or platelike member 1 made of an insulating substratum and including two opposed major surfaces 15, 15a (see FIG. 2). Portions of one of these surfaces are provided with a metal lining or coating 2, i.e. one of these surfaces is at least partly metallized, the metal in this case being copper. In addition, the member 1 is provided with holes or passages 3 extending from one to the other of the major surfaces 15, 15a thereof so that each of the passages has an open end at both major surfaces of the member 1. Each of the passages 3 is here shown as passing through one of the coated portions 2 of the member 1.

As may be seen in FIG. 2, the apparatus includes an arrangement for conveying the member 1 in a predetermined direction or along a predetermined path indicated by the arrow 14. The path 14 may extend substantially horizontally or may be inclined to the horizontal, although the angle of inclination with respect to the horizontal should preferably not exceed 10° as shown. The member 1 is conveyed along the path 14 via a track in such a manner that the major surface 15 thereof, which is provided with the coated portions 2, faces downwardly. The member 1 first passes over a container 7 containing a fluxing agent or flux. The flux is forced through a conduit 9, which is flanged at its upper end, by non-illustrated means such as a pump, for example, so a to produce a foamed swell or wave 8 of the flux. The wave 8 is of sufficient height to contact the surface 15 of the member 1. The unused foam in the wave 8 flows over the flanges at the upper end of the conduit 9 and returns to the container 7 as indicated by the arrows. As the member 1 continues to move along the path 14 away from the container 7, it next passes over a container 4. The container 4 contains the molten solder such as, for example, soft solder, which is to be applied to and coated on the member 1 and which forms the so-called "wave bath." The solder is pumped from the lower portion or compartment 4a of the container 4, by non-illustrated pump means, into a conduit 5 which directs the molten solder upwardly. The molten solder leaves the conduit 5 in the form of a directed wave or stream 6 which arcs around, as indicated by the arrows, so that any unused solder falls into the upper portion or compartment 4b of the container 4. The stream 6 attains a height sufficient to contact the surface 15 of the member 1. Thus, in this illustration, the molten solder is applied to the member 1 by the surge technique. After passing over or through the stream 6, the member 1 is then conveyed beneath a vacuum or suction chamber 10 provided with an opening 11 which lies adjacent the major surface 15a of the member 1. The suction or negative pressure in chamber 10 is produced by a nonillustrated suction blower or pump. It is seen that the suction is applied to the member 1 at a location thereof, or at those ends of the passages 3, remote from the location where the molten solder is applied to the member 1. The suction serves to remove from the passages 3 any molen solder which has flowed therein or which has formed a film or layer across the openings thereof so that possible blockage of the passages is prevented. The suction should be applied to the member 1 prior to solidification of the molten solder. The chamber 10 communicates with the suction pump via a cyclone 12 which is connected to the chamber 10 by a pipe 16. The cyclone 12 serves to separate out or collect any solder particles drawn in through the chamber 10 by the suction. Located below the chamber 10 is a hot air blower 13 which serves to direct a current of heated air onto the surface 15 of the member 1 via a pipe or tube 17 as shown by the arrows. The purpose of the blower 13 is to maintain the solder on the surface 15 of the member 1 in its molten state after the member 1 has passed through the stream 6 of molten solder. Thus, solidification of the solder is prevented until the solder passes out of the range of influence of the suction produced by the chamber 10. Examples of soft solders which may be used in a process such as described are tin solder or solders composed of tin-lead alloys.

Although, for the purpose of illustrating the invention, the apparatus for coating a plate-like printed circuit board with a solder has been described, this is not intended to limit the invention to such applications only. The principles of the invention are equally applicable to members of any configuration which are provided with at least one passage and where any hardenable material in flowable state is to be applied to the member in the region of an open end of the passage. This is also true regardless of the particular shapes of the passages, i.e. whether they are round or polygonal, and regardless of the fact whether the passages are straight or bent within the member. Furthermore, although prevention of possible blockage of the passages has been described as being accomplished by suction, it is understood that the same effect may be obtained by causing any suitable pressure fluid to flow through the passage or passages and that the pressure may be either greater or less than atmospheric, i.e. either a positive or a negative pressure. Also, it is, of course, possible to direct more than one stream of flowable material against the member to be coated and to direct more than one current of heated air against It will be understood that each of the elements described above, or two or more together, may also find a useful application in other types of apparatus differing from the types described above.

While the invention has been illustrated and described as embodied in a coating apparatus, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims:

1. In an apparatus for solder-coating a member having two major surfaces and provided with at least one passage which communicates the major surfaces, a combination comprising means for advancing the member in a predetermined path and in a given direction; means for contacting at least one of the major surfaces with molten solder as the member advances in said path so that excess solder at least partially obstructs the passage; means for maintaining the temperature of at least said excess solder obstructing the passage above its melting temperature as long as the member advances in a portion of said path downstream of said contacting means in said direction; and means for clearing the passage, including a suction source, and a suction nozzle adjacent said downstream portion of said path and directed against one of the major surfaces of the member when the latter advances in said downstream portion, said suction nozzle communicating with said suction source whereby a fluid stream is drawn through the passage when the latter communicates with said suction nozzle, which fluid stream entrains said excess solder and removes it from said passage.

2. A combination as defined in claim 1, and further comprising means for applying a flux to the one major surface, said applying means being located upstream of said contacting means when considered in said direction.

3. A combination as defined in claim 2, wherein said applying means includes a container adjacent said path and accommodating said flux, and an arrangement for generating a swell on said flux which contacts the one major surface as the member advances in said path along said container.

4. A combination as defined in claim 1, wherein said advancing means includes an elongated track, and an arrangement for mounting the member on said track for displacement longitudinally thereof and in said direction.

5. A combination as defined in claim 4, wherein said track encloses an angle of between and including 0° and 10° with the horizontal.

6. A combination as defined in claim 1, wherein said contacting means includes a bath of molten solder adjacent to said path, and an arrangement for producing a swell of molten solder in said bath which contacts the one major surface as the member advances in said path along said bath.

7. A combination as defined in claim 1, wherein said maintaining means includes a blower, and a conduit arrangement for conducting hot fluid pumped by said blower to a portion of the one major surface which advances in said path portion.

8. A combination as defined in claim 1, wherein said clearing means further includes a separator intermediate said suction nozzle and said suction source for removing said entrained excess solder from said fluid stream.

9. In an apparatus for solder-coating a member having two major surfaces and provided with at least one passage which communicates the major surfaces, a combination comprising means for advancing the member in a predetermined path and in a given direction; means for contacting at least one of the major surfaces with a molten solder as the member advances in said path whereby excess solder becomes lodged in the passage, including a bath of molten solder adjacent to said path, and an arrangement for producing a swell of molten solder in said bath which contacts the one major surface as the member advances in said path along said bath; means for keeping the temperature of at least said excess solder in the passage above its melting temperature as long as the member advances in a portion of said path downstream of said contacting means in said direction, including a blower, and a conduit arrangement for conducting hot fluid pumped by said blower to a portion of the one major surface which advances in said path portion; and means for passing a fluid stream through the passage as the member advances in said path portion so that this fluid stream entrains said excess solder in, and removes it from, the passage, including a suction source, a suction nozzle adjacent to a portion of the other major surface which advances in said path portion and communicating with said suction source so that the fluid stream is drawn through the passage from the one major surface into said nozzle and toward said suction source, and a separator intermediate said suction nozzle and said suction source for removing said entrained excess solder from said fluid stream.

10. In an apparatus for solder-coating a member having two major surfaces and provided with at least one passage which communicates the major surfaces, a combination comprising means for advancing the member in a predetermined path and in a given direction; means for contacting at least one of the major surfaces with a molten solder as the member advances in said path whereby excess solder becomes lodged in the passage; means for keeping the temperature of at least said excess solder in the passage above its melting temperature as long as the member advances in a portion of said path downstream of said contacting means in said direction; and means for passing a fluid stream through the passage as the member advances in said path portion so that this fluid stream entrains excess solder in, and removes it from, the passage, including a suction source, a suction nozzle adjacent to a portion of the other major surface which advances in said path portion and communicating with said suction source so that fluid stream drawn through the passage from the one major surface into said nozzle and toward said suction source, and, a separator intermediate said suction nozzle and said suction source for removing said entrained excess solder from said fluid stream.

* * * * *